(12) United States Patent
Liou et al.

(10) Patent No.: US 7,566,597 B2
(45) Date of Patent: Jul. 28, 2009

(54) MANUFACTURING METHOD OF THIN FILM TRANSISTOR ARRAY SUBSTRATE

(75) Inventors: Meng-Chi Liou, Taoyuan County (TW); Hsiao-Fen Chen, Taipei County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/938,773

(22) Filed: Nov. 12, 2007

(65) Prior Publication Data

US 2008/0064150 A1     Mar. 13, 2008

Related U.S. Application Data

(62) Division of application No. 11/163,814, filed on Oct. 31, 2005, now Pat. No. 7,319,237.

(30) Foreign Application Priority Data

Oct. 24, 2005  (TW) ............................... 94137108 A (51) Int. Cl.
*H01L 21/00* (2006.01)
(52) U.S. Cl. .................. 438/149; 438/151; 257/59; 257/72; 257/E27.13; 257/E33.001

(58) Field of Classification Search ......... 438/149–159; 257/57, 59, 60, 67, 72
See application file for complete search history.

(56) References Cited

U.S. PATENT DOCUMENTS 6,678,017 B1 * 1/2004 Shimomaki et al. ........... 349/40

\* cited by examiner

*Primary Examiner*—Hsien-ming Lee
(74) *Attorney, Agent, or Firm*—Jianq Chyun IP Office (57) ABSTRACT

A thin film transistor array substrate and a manufacturing method thereof are provided. Wherein, scan lines and data lines are disposed on a substrate to define a plurality of pixel regions. Thin film transistors are disposed in the pixel regions correspondingly and driven by the scan lines and the data lines. Pixel electrodes are disposed in the pixel regions respectively and electrically connected to the corresponding thin film transistors. In addition, a gate insulating layer is disposed on the substrate to cover the scan lines and gates of the thin film transistors. A patterned leaning layer is disposed on the gate insulating layer and forms a plurality of non-continuous patterns under the data lines. The non-continuous patterns expose portions of the gate insulating layer under the data lines to which a portion of each data line can be directly attached.

4 Claims, 11 Drawing Sheets

MANUFACTURING METHOD OF THIN FILM TRANSISTOR ARRAY SUBSTRATE

CROSS-REFERENCE TO RELATED APPLICATION

This application is a divisional of an application Ser. No. 11/163,814, filed on Oct. 31, 2005, now U.S. Pat. No. 7,319,237, which claims the priority benefit of Taiwan application serial no. 94137108, filed on Oct. 24, 2005. The entirety of each of the above-mentioned patent applications is hereby incorporated by reference herein and made a part of this specification.

BACKGROUND OF THE INVENTION

1. Field of Invention

The present invention relates to an active device array substrate and a manufacturing method thereof, and particularly to a thin film transistor array substrate and a manufacturing method thereof.

2. Description of the Related Art

Display is a communication interface between human and information. Nowadays, the flat display has become the trend of development in the display field. The flat panel display primarily includes: organic electroluminescence display (OLED), plasma display panel (PDP), and thin film transistor liquid crystal display (TFT-LCD). Wherein, the thin film transistor liquid crystal display is applied most generally.

The thin film transistor liquid crystal display mainly comprises a thin film transistor array substrate, a color filter, and a liquid crystal layer. The thin film transistor array substrate comprises a plurality of pixel units arranged in an array, wherein every pixel unit is composed of thin film transistor and a data line, a scan line, and a pixel electrode electrically connected thereto. The foregoing thin film transistor comprises a gate, a channel layer, a source and a drain, and is used as a switch for the pixel unit.

Figure 1A:
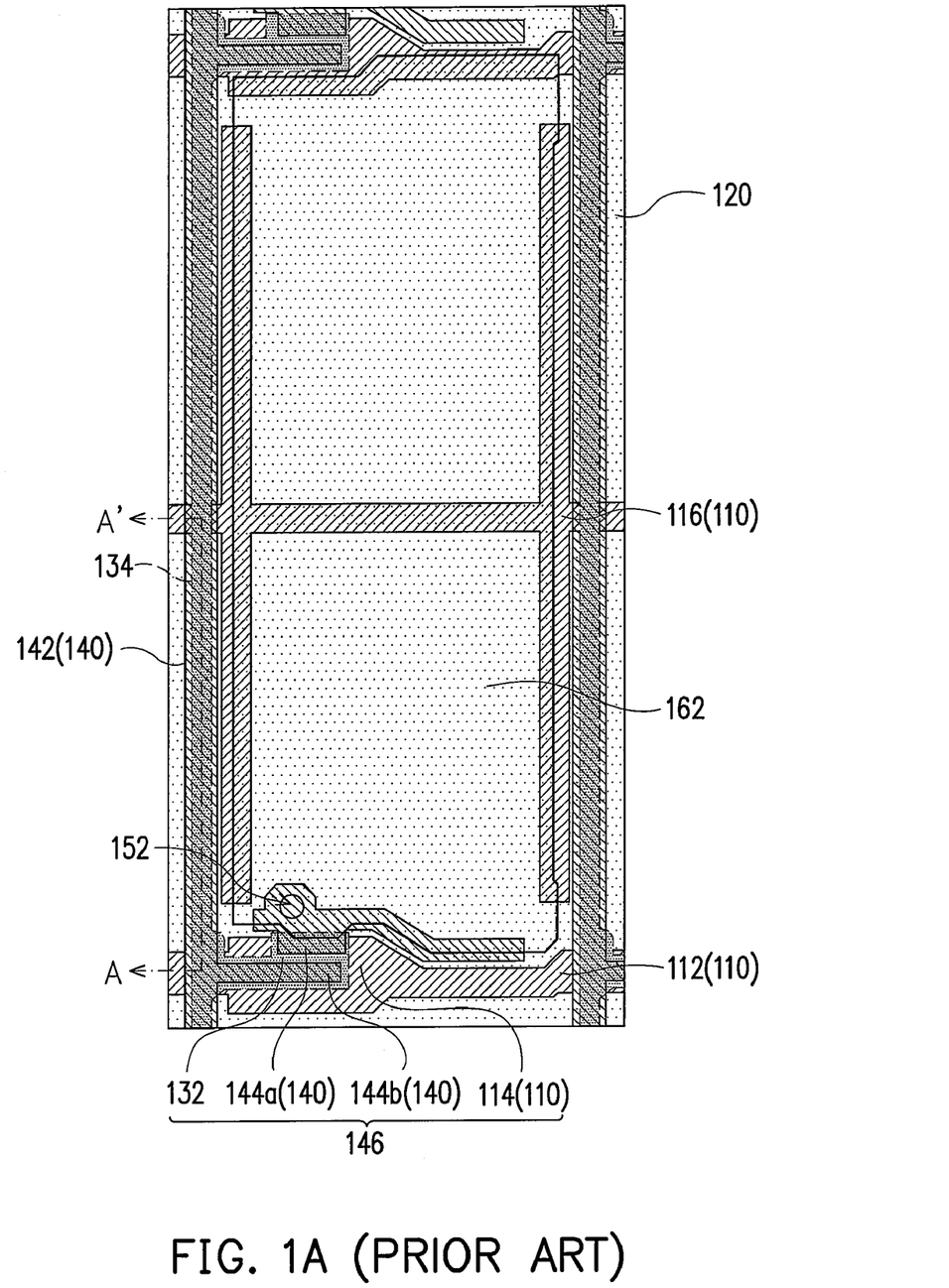
FIG. 1A is a top view of a conventional thin film transistor array substrate.
Figure 1B:
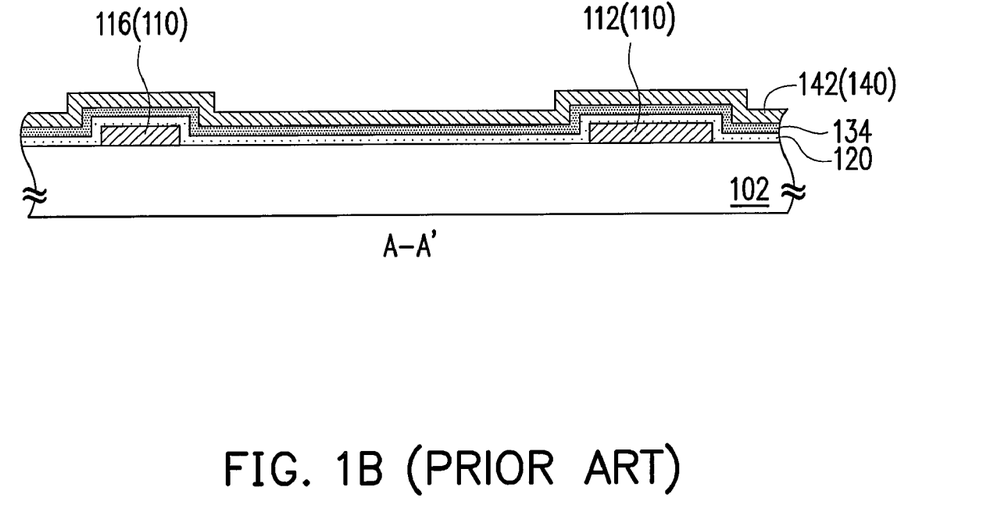
FIG. 1B is a cross-sectional diagram along the line A-A' of FIG. 1A.

FIG. 1A is a top view of a conventional thin film transistor array substrate. FIG. 1B is a cross-sectional diagram along the line A-A' in FIG. 1A. As shown in FIG. 1A and FIG. 1B, a first metal layer 110 is disposed on a substrate 102, wherein the first metal layer 110 comprises scan lines 112, gates 114, and common lines 116. Besides, a gate isolating layer 120 covers the first metal layer 110, wherein the material of the gate isolating layer 120 may be silicon nitride. Moreover, channel layers 132 are disposed on the gate isolating layer 120 and corresponding to the gates 114. A second metal layer 140 is disposed on the substrate 102, wherein the second metal layer 140 comprises data lines 142, sources 144a, and drains 144b.

Referring to FIG. 1A and FIG. 1B, the source 144a and drain 144b are disposed on both sides of the channel layer 132 above the gate 114. The gate 114, the channel layer 132, the source 144a, and the drain 144b form a thin film transistor 146. In addition, a passivation layer (not shown) is disposed on the first metal layer 110, the gate insulating layer 120, and the second metal layer 140, wherein the passivation layer (not shown) comprises an opening 152 in which the drain 144b exposes. Besides, a pixel electrode 162 is disposed on the passivation layer and electrically connected with the drain 144b through the opening 152. Moreover, conventionally, for reducing the probability of producing current leakage due to incomplete back channel etching during patterning second metal layer 140, a semiconductor layer 134 is reserved under the data line 142 when making channel layer 132.

According to the above description, the conventional manufacture or use of the thin film transistor array substrate generally has defects such as:

1. During the manufacturing process of the thin film transistor array substrate, a plasma bombard is employed to produce charges of gas molecules in the step of dry etching, and thus the charges may accumulate easily. After a period of time, the accumulated charges may punch through the formed metal layer, so as to form a short circuit between the first metal layer and the second metal layer.

2. The excess semiconductor material under the pixel electrode may lead to defects or brightness dots during display.

3. The data line is disposed on the semiconductor layer. However, the data line is formed of material such as chromium (Cr), molybdenum (Mo), or wolfram (W), which has low adhesion with amorphous silicon. Therefore, the data lines may be easily broken in the manufacturing process.

SUMMARY OF THE INVENTION

Accordingly, an object of the present invention is to provide a thin film transistor array substrate, so as to reduce the destruction of static electricity and broken data lines and to decrease the probability of producing brightness dots due to the residue of the semiconductor material.

Another object of the present invention is to provide a method for manufacturing thin film transistor array substrate with higher productive yields, so as to avoid the above-mentioned problems and to reduce manufacture cost.

Based on the foregoing or other purposes, the present invention provides a thin film transistor array substrate comprising a substrate, a plurality of scan lines, a plurality of data lines, a plurality of thin film transistors, a plurality of pixel electrodes, a gate insulating layer, and a patterned leaning layer. Wherein, the scan lines and the data lines are disposed on the substrate to define a plurality of pixel regions. The thin film transistors are corresponding to the pixel regions and driven by the scan lines and the data lines. In addition, the pixel electrodes are disposed in the pixel regions respectively and each of the pixel electrodes is electrically connected with the corresponding thin film transistor. Moreover, the gate insulating layer is disposed on the substrate to cover the gates of the thin film transistor and the scan lines. The patterned leaning layer is disposed on the gate insulating layer and correspondingly located under the data lines. Wherein, the patterned leaning layer forms a plurality of non-continuous patterns under each of the data lines, and the non-continuous patterns expose portions of the gate insulating layer under the data lines. Therefore, a part of each of the data lines is attached to the gate insulating layer underneath.

According to an embodiment of the present invention, the above-described thin film transistor array substrate further comprises a plurality of common lines, which are parallel to the scan lines and alternately disposed on the substrate with the scan lines. Besides, the gate insulating layer further covers the common lines.

According to an embodiment of the present invention, a plurality of branches are extended outward from both sides of each of the foregoing common lines, wherein these branches are adjacent to the data lines closely.

According to an embodiment of the present invention, the material of the above-described patterned leaning layer is, for example, amorphous silicon.

According to an embodiment of the present invention, the above-described non-continuous patterns are disposed at the intersections of the scan lines and the data lines and at the intersections of the common lines and the data lines. Furthermore, the non-continuous patterns extend along the corresponding data lines.

The present invention provides a manufacturing method of a thin film transistor array substrate. First, a substrate is provided, wherein a plurality of pixel regions are defined on the substrate. Next, a plurality of scan lines and a plurality of gates are formed on the substrate. Then, a gate insulating layer is formed on the substrate to cover the scan lines and the gates. Moreover, a semiconductor layer is formed and patterned on the gate insulating layer to form a patterned leaning layer and form an island structure above each of the gates respectively. Furthermore, a source and a drain are formed in both sides of the island structure above each of the gates and a plurality of data lines are formed simultaneously. Wherein the patterned leaning layer is correspondingly located under the data lines and the patterned leaning layer comprises a plurality of non-continuous patterns disposed under each of the data lines and exposing portions of the gate insulating layer under the data lines, so as to make a part of each data line directly attach to the gate insulating layer underneath. Afterwards, a passivation layer is formed on the substrate and a plurality of openings is formed in the passivation layer to expose the sources and drains. Finally, a pixel electrode is formed on the passivation layer in each of the pixel regions respectively, wherein each of the pixel electrodes is electrically connected with the corresponding source and drain via the corresponding opening.

According to an embodiment of the present invention, the manufacturing method further comprises forming a plurality of common lines substantially parallel to the scan lines and alternately disposed on the substrate with the scan lines as forming the scan lines and the gates.

According to an embodiment of the present invention, a plurality of branches are extended outward from both sides of each of the above-described common lines and these branches are adjacent to the data lines closely.

According to an embodiment of the present invention, the above-described non-continuous patterns are disposed at the intersection of the scan lines and the data lines and at the intersection of the common lines and the data lines. Furthermore, the non-continuous patterns extend along the corresponding data lines.

Accordingly, the invention designs the discontinuous semiconductor layer under the data lines instead of the conventional continuous pattern without changing any manufacturing process and the number of mask. Therefore, when static electricity occurs, the path for transferring the static electricity is cut off to reduce the source producing the destruction of static electricity. Besides, because the area of the semiconductor layer decreases, the adhesion of the source and drain metal is enhanced to prevent broken data lines. Moreover, the occurring probability of the brightness dots is also reduced due to the decrease of the area of the semiconductor layer. Therefore, without increasing the number of mask or any manufacture cost, the present invention not only achieves the foregoing three effects, but also effectively raises the productive yields and reduces the cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Referring to FIG. 2A to FIG. 2F, which are top views of the manufacturing method for a thin film transistor array substrate according to an embodiment of the present invention.

Figure 2A:
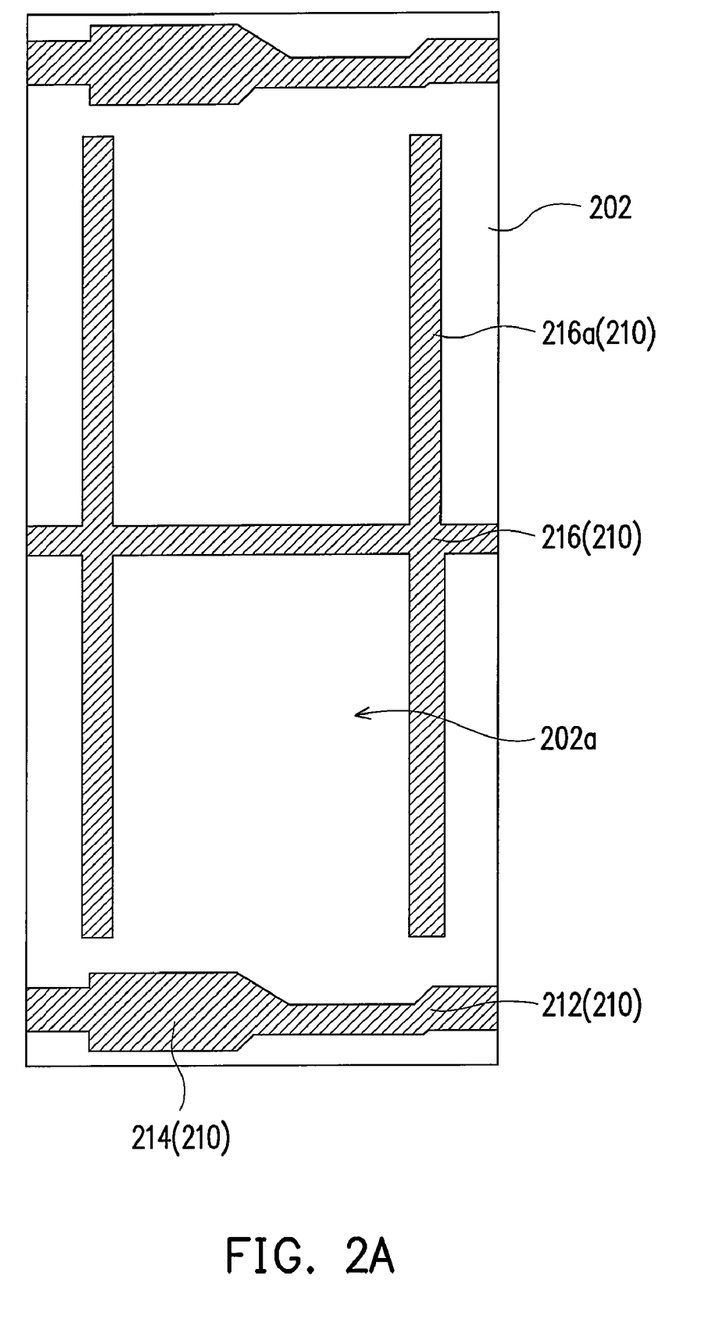
FIG. 2A to FIG. 2F are respectively overlook schematic diagrams of the manufacturing method for a thin film transistor array substrate according to an embodiment of the present invention.

First, as shown in FIG. 2A, a substrate 202 is provided, wherein a plurality of pixel regions 202a are defined on the substrate 202 and a first metal layer 210 is formed on the substrate 202. Then, the first metal layer 210 is patterned to form a scan line 212 and a plurality of gates 214. In the embodiment, the substrate 202 is, for example, a glass substrate or a transparent substrate formed of other kind of material, and the first metal layer 210 is formed of material such as chromium (Cr), molybdenum (Mo), or wolfram (W).

Accordingly, when the present invention is patterning the first metal layer 210, a plurality of common lines 216 may be formed on the substrate 202, wherein the common lines 216 are parallel to the scan lines 212 and alternately disposed on the substrate with the scan lines 212. In addition, both sides of each common line 216 have a plurality of branches 216a extended outward.

Figure 2B:
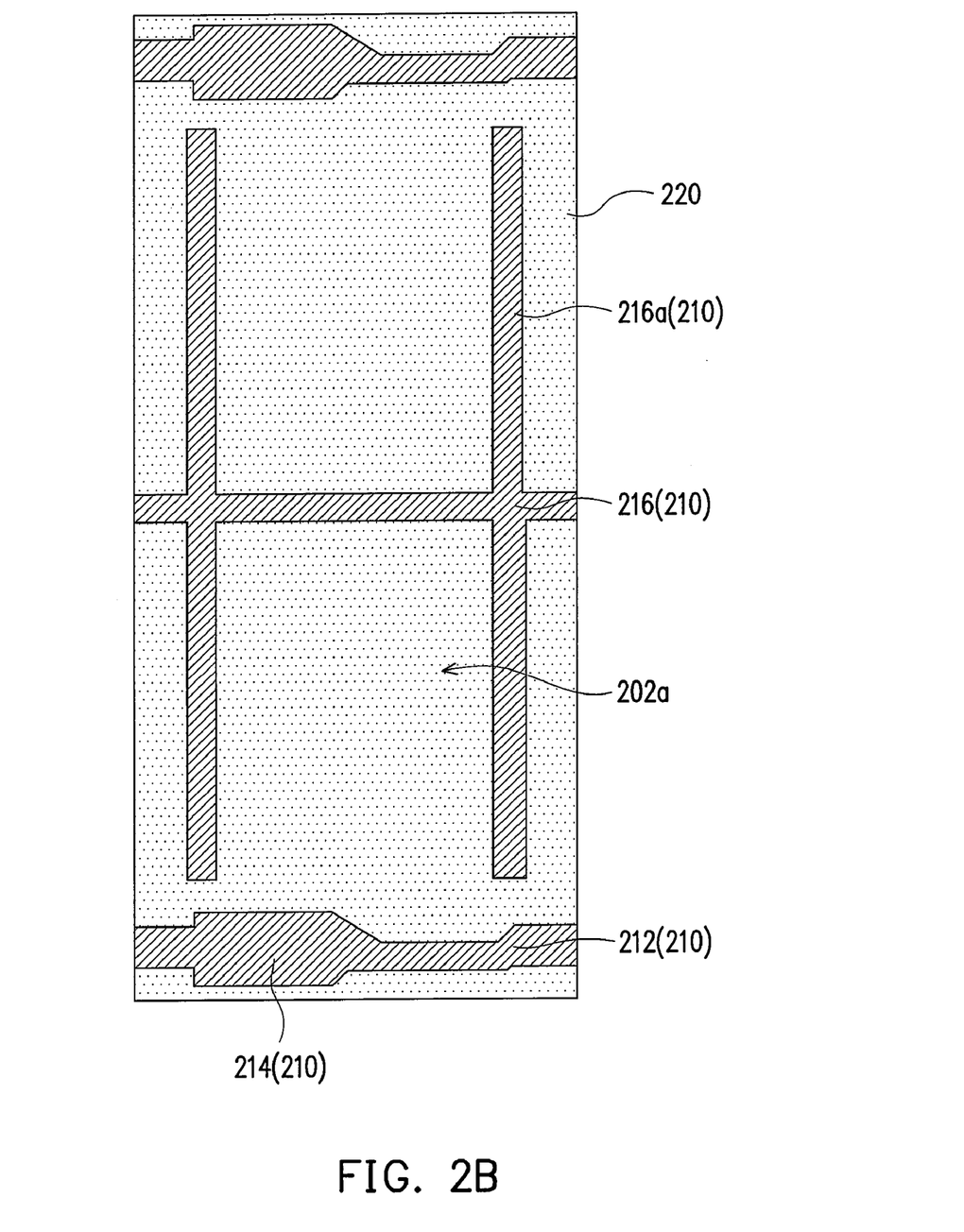

Next, as shown in FIG. 2B, a gate insulating layer 220 is formed on the substrate 202 and the gate insulating layer 220 covers the scan line 212 and gates 214. In the embodiment, the gate insulating layer 220 is formed of, for example, silicon nitride (SiN).

Figure 2C:
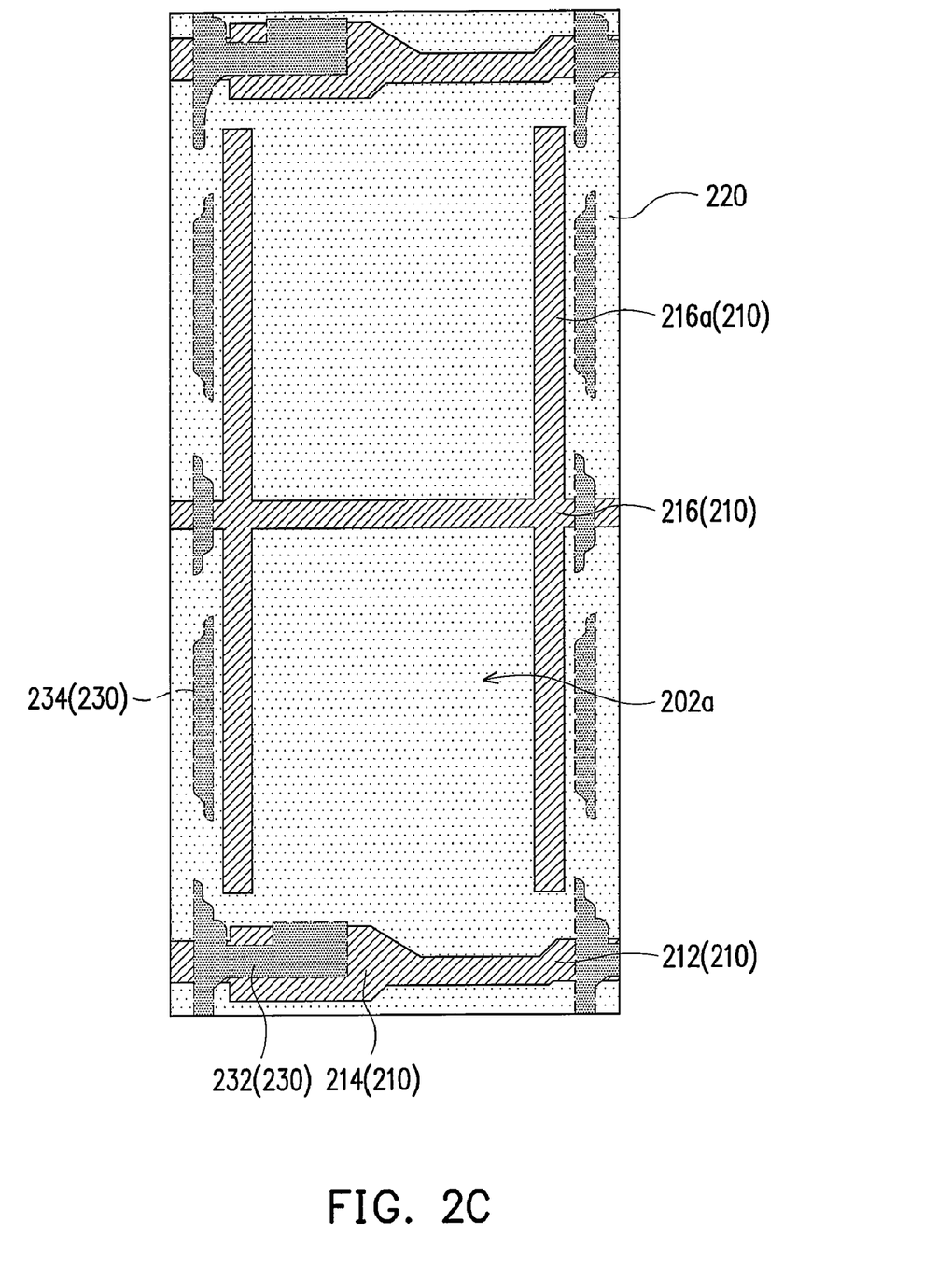

Then, as shown in FIG. 2C, a semiconductor layer 230 is formed on the gate insulating layer 220 and the semiconductor layer 230 is patterned to form an island structure 232 above each of the gates 214, which is used as the channel layer of the thin film transistor. In addition, a patterned leaning layer 234 is further formed on the location pre-determined to form the data lines. The patterned leaning layer 234 comprises, for example, a plurality of non-continuous patterns. In the embodiment, the semiconductor layer 230 is formed of, for example, amorphous silicon.

Figure 2D:
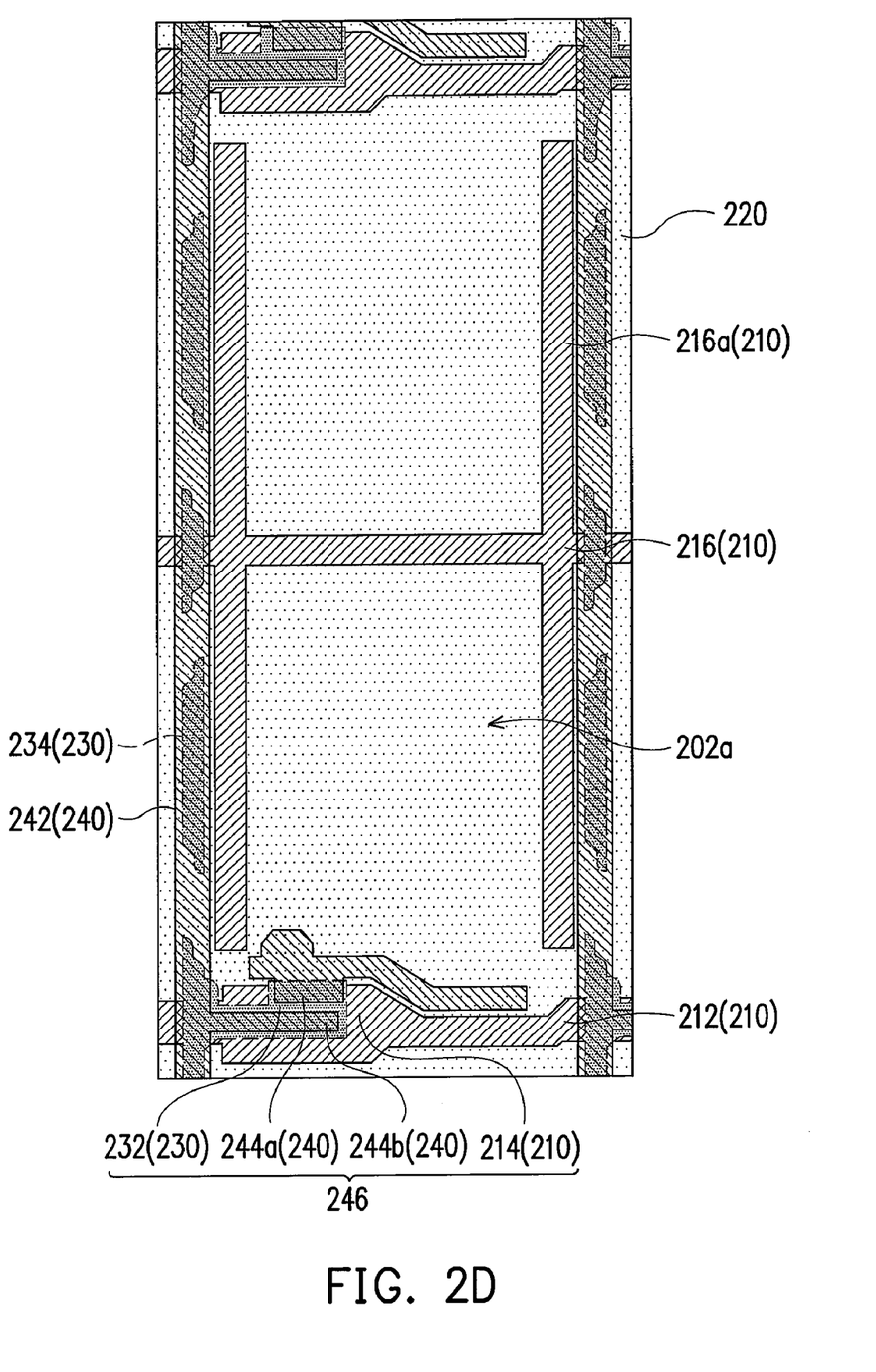

Afterwards, as shown in FIG. 2D, a second metal layer 240 is formed on the substrate 202 and the second metal layer 240 is patterned to form a source 244a and a drain 244b in both sides of the island structure 232 above each of the gates 214 and to form a plurality of the data lines 242. Wherein, the second metal layer 240 is formed of material such as chromium (Cr), molybdenum (Mo), or wolfram (W). In the embodiment, the branches 216a of each of the common lines 216 are, for example, disposed adjacent to the data lines 242 closely. Besides, the source 244a, the drain 244b, the corresponding gate 214, and the island structure 232 used as channel layer form a thin film transistor 246 which can be driven by the corresponding scan line 212 and the corresponding data line 242.

Accordingly, because the non-continuous patterns of the patterned leaning layer 234 is correspondingly disposed under the data lines 242, so as to expose portions of the gate insulating layer 220 under the data lines 242. Therefore, when the data lines 242 are formed, a part of each of the data lines 242 can be directly attached to the gate insulating layer 220 underneath.

Figure 2E:
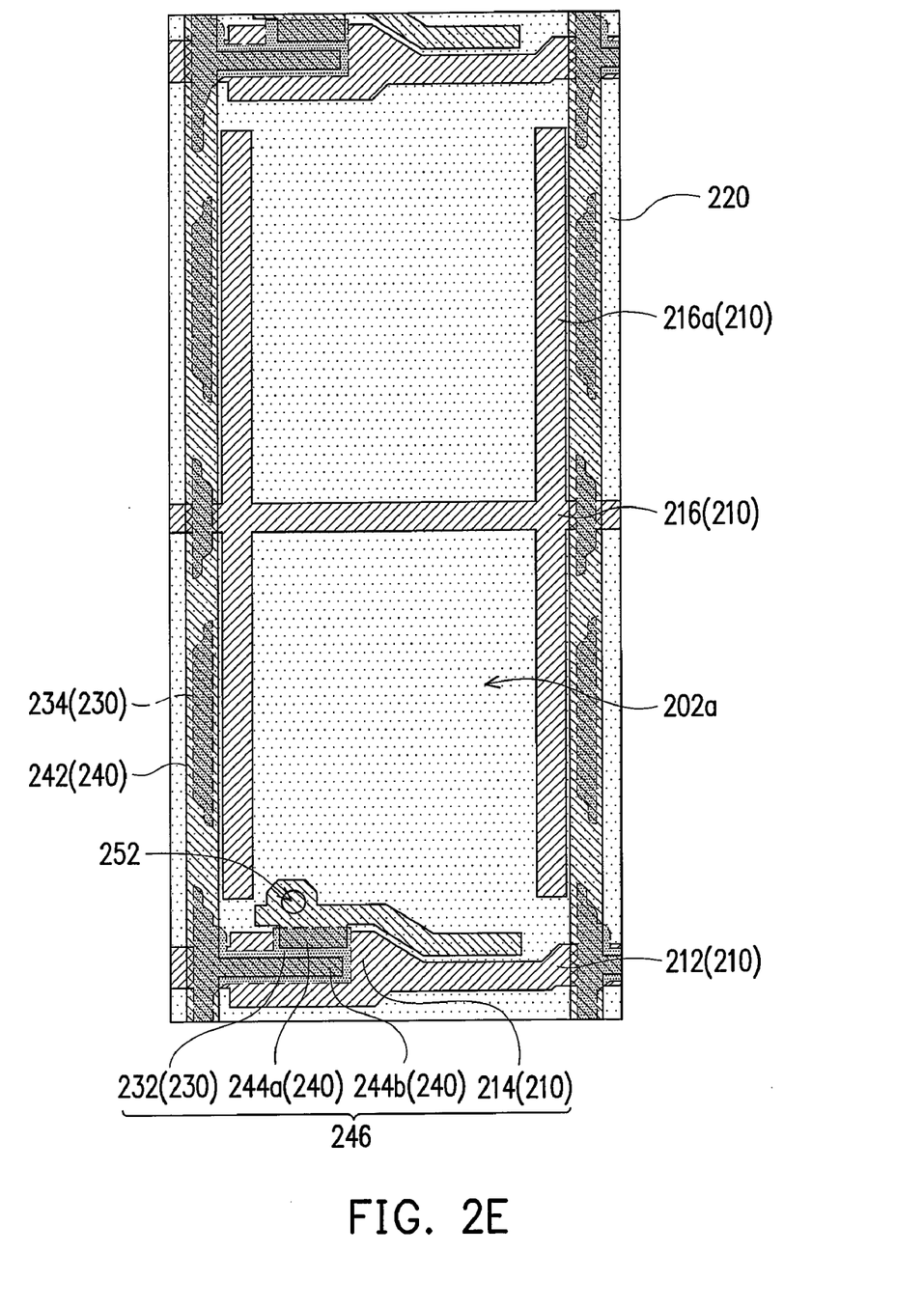

Next, as shown in FIG. 2E, a passivation layer (not shown) is formed on the substrate 202, wherein the passivation layer (not shown) covers the gate insulating layer 220, the semiconductor layer 230, and the second metal layer 240. The passivation layer (not shown) is formed of, for example, silicon nitride (SiN). Furthermore, a plurality of openings 252 are formed in the passivation layer (not shown) to expose the drains 244b.

Figure 2F:
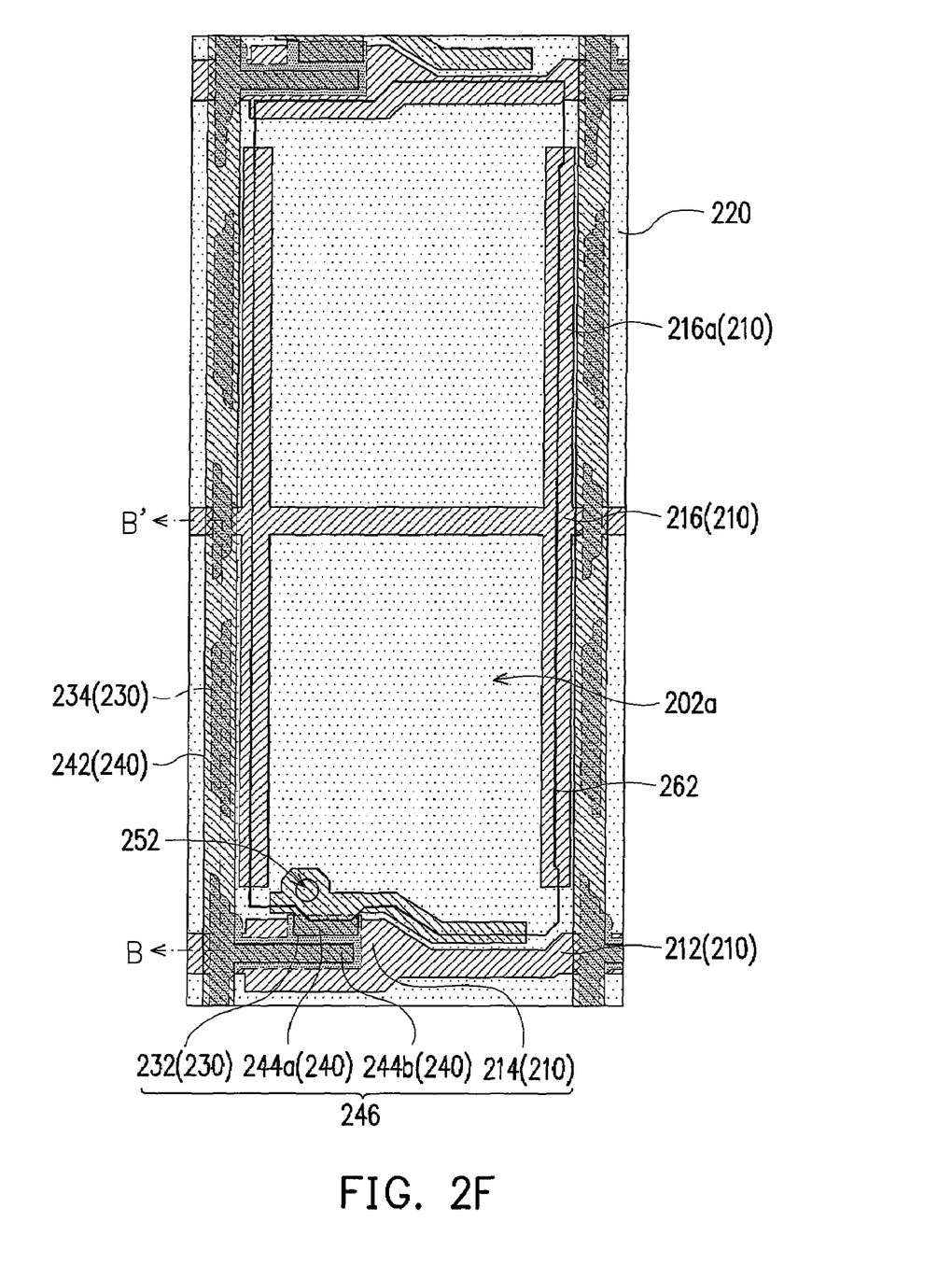

Finally, as shown in FIG. 2F, a pixel electrode 262 is formed on the passivation layer 250 in each of the pixel regions 202a respectively, wherein each of the pixel electrodes 262 is electrically connected with the corresponding drain 244b through the corresponding opening 252. In the embodiment, the pixel electrode 262 is formed of, for example, Indium Tim Oxide (ITO) or other transparent and conductive materials.

Figure 3:
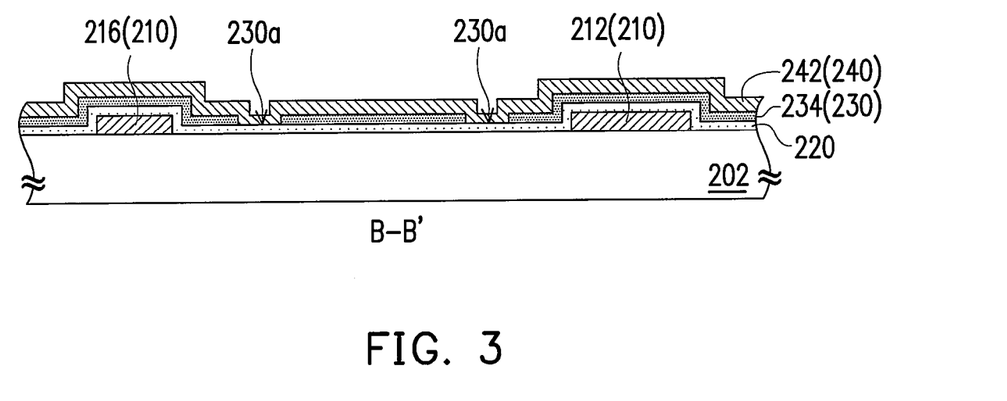
FIG. 3 is a cross-sectional schematic diagram along the line B-B' of FIG. 2F.

Based on the foregoing description, referring to FIG. 2F and FIG. 3 simultaneously, wherein FIG. 3 shows a cross-sectional schematic diagram along the line B-B' of FIG. 2F. The present invention fabricates the non-continuous patterned leaning layer 234 under the data line 242 as forming the semiconductor layer 230 by the original process and with an identical number of masks. Therefore, when the static electricity occurs, the path for transferring static electricity is cut off to reduce the probability of static electricity destruction. Moreover, because of the decrease of the area of the semiconductor layer, the adhesion of the source and drain metal is enhanced to reduce the broken data lines, so as to decrease the probability of producing brightness dots.

In the foregoing embodiment of the present invention, a plurality of openings 230a are formed in specific positions on the semiconductor layer 230 under the data line 242 to form the patterned leaning layer 234 which comprises a plurality of non-continuous patterns. Wherein, the non-continuous patterns of the patterned leaning layer 234 are disposed at the intersections of the scan lines 212 and the data lines 242, at the intersections of the common lines 216 and the data lines 242 and under the data lines 242.

Figure 4A:
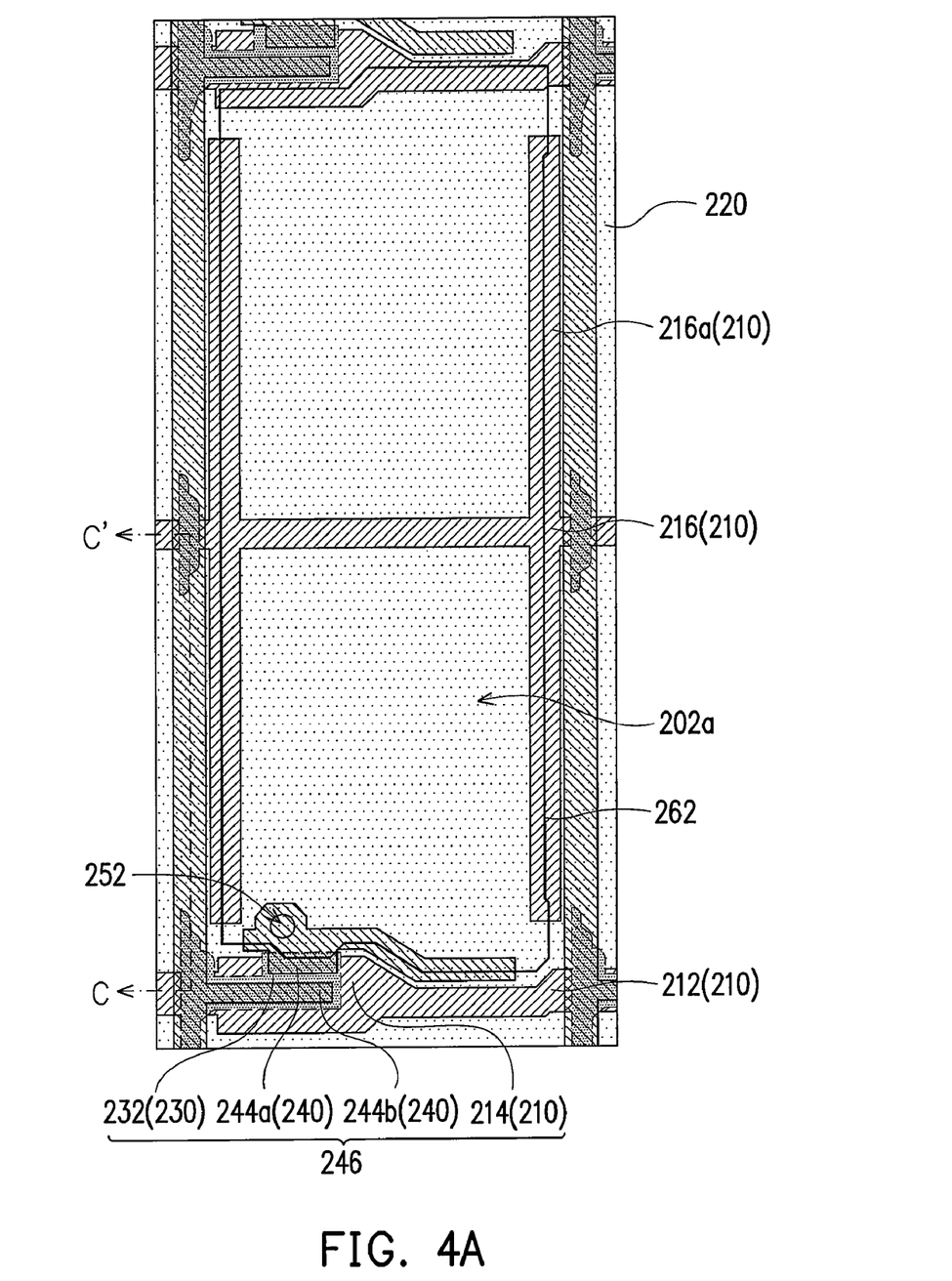
FIG. 4A is a top view of a thin film transistor array substrate according to another embodiment of the present invention.
Figure 4B:
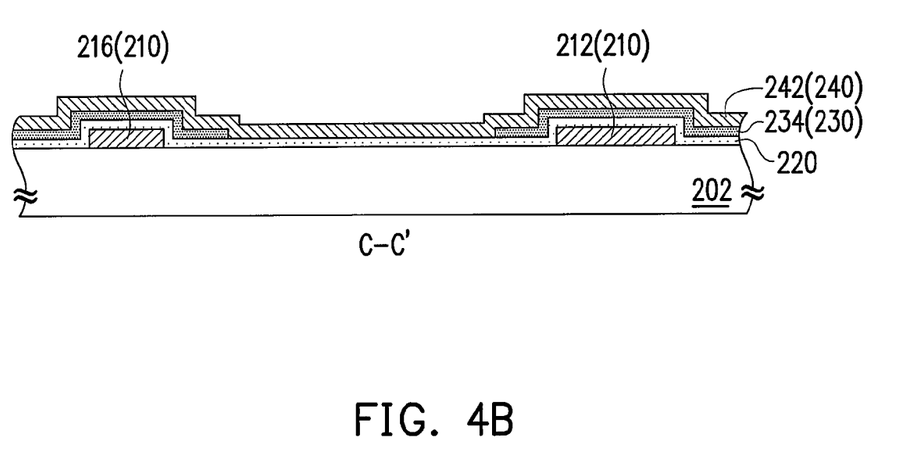
FIG. 4B is a cross-sectional schematic diagram along the line C-C' of FIG. 4A.

Certainly, the patterned leaning layer 234 in the present invention is not limited to the one disclosed by the foregoing embodiments. FIG. 4A is a top view of a thin film transistor array substrate according to another embodiment of the present invention. FIG. 4B is a cross-sectional schematic diagram along the line C-C' of FIG. 4A. Referring to FIG. 4A and FIG. 4B, in the embodiment, the patterned leaning layer 234 is only formed at the intersection of the scan lines 212 and the data lines 242 and at the intersection of the common lines 216 and the data lines 242. Wherein, the non-continuous patterns of the patterned leaning layer 234 are extended along with the corresponding data line 242.

Accordingly, in the design of the pattern arrangement of the semiconductor layer, the area of the patterned leaning layer can further be modified in order to make overall area of the semiconductor layer on the thin film transistor array substrate applied by different machines the same. Therefore, as patterning the semiconductor layer by dry etching, the recipe of the step of dry etching is invariable and the control of manufacturing process control is simplified.

To sum up, the thin film transistor array substrate and the manufacturing method of the present invention can form a patterned leaning layer under the data line without increasing the number of mask or any manufacturing cost and at least has following features and advantages:

1. When the area of the semiconductor layer under the data line reduces, the amount of the charge accumulation also reduces accordingly. When static electricity occurs, not only the path for transferring the static electricity can be cut off, but the first metal layer and the second metal layer can avoid being punched through. Therefore, the short circuit between the data line and the common line or between the scan line and the data line can be eliminated and the yield of the manufacturing process and the reliability of the product can be enhanced.

2. By reducing the area of the pattern arrangement on the semiconductor layer, the probability of the defects can be reduced. The residual semiconductor layer under the pixel electrode that results in brightness dot can be prevented. Therefore, the present invention can improve the yield of the manufacturing process and the display quality of the panel.

3. Since the metal material of the data line, such as chromium (Cr), molybdenum (Mo), or wolfram (W), has better adhesion with silicon nitride, the material of the gate insulating layer, more adhesive area between the data lines and the gate insulating layer is provided by the patterned leaning layer, so as to avoid the broken data lines. Therefore, the manufacturing process has higher yields and the manufacturing cost can be reduced.

4. The overall area of the semiconductor layer can be modified as designing by the patterned leaning layer to achieve consistent recipe. Therefore, the trouble of adjusting recipe can be reduced to simplify the control of the following manufacturing process.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A manufacturing method for a thin film transistor array substrate comprising:

providing a substrate, wherein a plurality of pixel regions are defined on the substrate;

forming a plurality of scan lines and a plurality of gates on the substrate;

forming a gate insulating layer covering the scan lines and the gates on the substrate;

forming and patterning a semiconductor layer on the gate insulating layer to form a patterned leaning layer and form island structures above the gates;

forming a plurality of sources and a plurality of drains in both sides of the island structures above the gates and forming a plurality of data lines, wherein the patterned leaning layer is correspondingly disposed under the data lines and the patterned leaning layer comprises a plurality of non-continuous patterns disposed under each of the data lines and exposing portions of the gate insulating layer under the data lines, so as to make a part of each data line directly attach to the gate insulating layer underneath;

forming a passivation layer and forming a plurality of openings in the passivation layer in order to expose the sources and drains; and forming pixel electrodes on the passivation layer in the pixel regions respectively, wherein each of the pixel electrodes is electrically connected with the corresponding source and drain via the corresponding opening.

2. The manufacturing method for a thin film transistor array substrate as recited in claim 1, further comprising forming a plurality of common lines substantially parallel to the scan lines and alternately disposed on the substrate with the scan lines as forming the scan lines and the gates.

3. The manufacturing method for a thin film transistor array substrate as recited in claim 2, wherein both sides of each of the common lines comprise a plurality of branches extended outward and the branches are adjacent to the data lines.

4. The manufacturing method for a thin film transistor array substrate as recited in claim 1, wherein the non-continuous patterns are formed at the intersection of the scan lines and the data lines and at the intersection of the common lines and the data lines, and the non-continuous patterns extend along the corresponding-data lines.

* * * * *